(12) United States Patent
Rajanish et al.

(10) Patent No.: US 8,179,333 B2
(45) Date of Patent: May 15, 2012

(54) ANTENNAS USING CHIP-PACKAGE INTERCONNECTIONS FOR MILLIMETER-WAVE WIRELESS COMMUNICATION

(75) Inventors: Fnu Rajanish, San Diego, CA (US);
Nitin Jain, San Diego, CA (US);
Gaurav Menon, San Diego, CA (US);
Angelos Alexanian, Somerville, MA (US)

(73) Assignee: Anokiwave, Inc., San Diego, CA (US)

( * ) Notice: Subject to any disclaimer, the term of this patent is extended or adjusted under 35 U.S.C. 154(b) by 463 days.

(21) Appl. No.: 12/437,809

(22) Filed: May 8, 2009

(65) Prior Publication Data
US 2010/0283700 A1    Nov. 11, 2010

(51) Int. Cl.
*H01Q 9/28*    (2006.01)

(52) U.S. Cl. ............. 343/795; 343/700 MS; 257/679
(58) Field of Classification Search ........... 343/700 MS, 343/793, 795; 257/679
See application file for complete search history.

(56) References Cited

U.S. PATENT DOCUMENTS

| | | | | |
|---|---|---|---|---|
| 7,295,161 | B2 * | 11/2007 | Gaucher et al. | 343/700 MS |
| 7,607,586 | B2 * | 10/2009 | Wang | 235/492 |
| 2008/0291107 | A1 * | 11/2008 | Tsai et al. | 343/803 |

* cited by examiner

*Primary Examiner* — Tho G Phan

(57) ABSTRACT

A compact millimeter-wave transmitter and receiver make use of interconnections within a chip-containing package for providing an integrated antenna. Due to shorter wavelength of millimeter-waves, these interconnections can be used as antennas for radiation of electromagnetic waves. A dielectric cover or lens is provided within the package to increase the antenna's directivity and to provide a mechanical shield for the chip.

24 Claims, 10 Drawing Sheets

Prior Art

ANTENNAS USING CHIP-PACKAGE INTERCONNECTIONS FOR MILLIMETER-WAVE WIRELESS COMMUNICATION

BACKGROUND

1. Prior Art

The millimeter-wave radio-frequency band typically spans 30 to 300 GHz. Since RF (radio frequency bands (<10 GHz) are getting crowded by wireless applications, millimeter-wave (mm-wave) bands (>10 GHz) are becoming more popular. In USA, the 60 GHz mm-wave band is unlicensed and has a large usable bandwidth of 7 GHz. It is being proposed for mm-wave short-range high-data-rate systems. Mm-wave wireless systems typically have transmitter and receiver circuitry, collectively called a transceiver. The transceiver is connected to antennas for communicating with another transceiver. The antenna transmits and receives electromagnetic waves through free space, thereby facilitating communication between two different transceivers. Heretofore the art recognized two approaches for implementing a transceiver and antenna combination for the 60 GHz mm-wave band.

The first approach is shown in FIG. 1, which shows a top view of a typical mm-wave module. A semiconductor chip 101 is placed on an electrically conductive paddle or flat metallic surface 104. The paddle, a part of package 103, is soldered onto a printed circuit board (PCB) 102. A paddle is a flat metallic surface usually in the middle of the package.

The chip contains transmitter and receiver circuits. Duplexer 109 separates the transmit signal from receive signal. In the transmit section is power-amplifier 110 and up-converter 111; up-converter translates the low frequency to high frequency. The receive section has a low-noise-amplifier 114 and a down-converter 115; down-converter translates the high frequency to low frequency. Interconnection 113 connects a metallic pad 112 on the chip to a pin 105 of the package. The interconnection carries the signals between the board and the duplexer on the chip. Package pin 105 is connected to traces or metallic transmission lines 115 on the board. If required, a balun 106, that converts balanced signal to unbalanced signal or vice-versa, may be provided. A balanced signal is a pair of signals with opposite polarity while an unbalanced signal is a signal with one polarity. Board-antenna 107 is fed by the balanced output from the balun. The antenna radiates electromagnetic-waves 116 in order to communicate with another mm-wave module.

This type of mm-wave module exploits the properties of the PCB for making a low-loss antenna. Many modern-day transceiver modules (such as those used in cell phones, automotive radars, and satellite communications) are made in this manner. However, interconnection 103 at the mm-wave frequency has very high parasitics such as unwanted inductance, capacitance, and resistance; thus this approach is difficult to use beyond 30 GHz. In addition, the size of the module is large. This first approach is explained in more detail in, "A Low-Power Fully Integrated 60 GHz Transceiver System with OOK Modulation and On-Board Antenna Assembly", J. Lee, Y. Huang, Y. Chen, H. Lu, C. Chang, ISSCC Conference Proceedings, San Francisco, 2009.

The second, alternative approach integrates the antenna and the chip and avoids the above difficulty has been proposed. The second approach is shown in FIG. 2. An on-chip-antenna 201 is included in the chip, which contains the transmitter and receiver circuits. This approach has no antenna on the board and no transition from board to chip; therefore, it has a smaller board size compared to the circuit of FIG. 1. However, it has a larger chip size. A planar antenna 201 is designed such that it is in resonance at the frequency of interest. Resonance occurs when the antenna radiates the highest energy. This type of integrated approach leads to a compact millimeter-wave transceiver module. It also reduces the package-to-board transition uncertainties and thereby helps reduce cost. This type of approach can be seen in the following three published articles: (1) "On the design of 60 GHz integrated antennas on 0.13 um SOI technology", Barakat, M. H.; Ndagijimana, F.; Delaveaud, C. IEEE International SOI Conference Proceedings, 2007, pp. 117-118; (2) "Apparatus and methods for constructing antennas using vias as radiating elements formed in a substrate" U.S. Pat. No. 7,444,734, Nov. 4, 2008; and (3) "Antenna-integrated microwave-millimeter-wave module", Sakota, Naoki; Yamada, Atsushi; Kitaoka, Koki, U.S. Pat. No. 6,388,623, May 14, 2002.

The prior-art circuits discussed have a number of drawbacks at millimeter waves. The approach of FIG. 1 will have low losses if the interconnections are well controlled and the boards are of good quality. However this increases manufacturing cost. In the approach of FIG. 2, the planar antenna requires relatively large chip area; hence the cost of the chip increases. Moreover, the efficiency of this on-chip antenna is poor at mm-waves because the substrate of the chip is thin and lossy. As a result, a significant amount of signal is lost on the chip.

Thus we have found that heretofore there has not been any available low-loss and inexpensive mm-wave antenna that can be integrated easily with the transceiver.

2. Advantages

Accordingly one or more aspects of the present system has the following advantages: The chip size is reduced, thereby reducing manufacturing cost. The interconnections can have air as surrounding medium; thus, the radiation can be efficient. It does not require any additional manufacturing steps; the regular bonding procedure used for interconnections is sufficient to make the antennas. In addition, the interconnection goes to either paddle or package pin and thus does not require any additional components and is easy to implement. This approach eliminates the parasitics and uncertainties that are present in the chip-to-board transitions. Antenna arrays can be easily made by using multiple interconnections. This greatly reduces chip and module size for phase array systems; thereby, significantly decreasing the cost. Further advantages of various embodiments and aspects will be apparent from the ensuing description and drawings.

SUMMARY

In one embodiment, an apparatus includes a semiconductor chip placed on an electrically conductive paddle with electrically conductive interconnections connecting the chip to another electrically conductive surface such that interconnections are designed to radiate as antennas. A dielectric cover encloses the antenna and is used for making an electromagnetic lens. A dielectric cover is designed as a lens for shaping a radiation pattern and provides increased directivity of the antenna in addition to providing chip protection. The interconnections designed as antennas provide a cost-effective solution for making an integrated compact millimeter-wave transceiver module.

DRAWINGS

Figure 1:
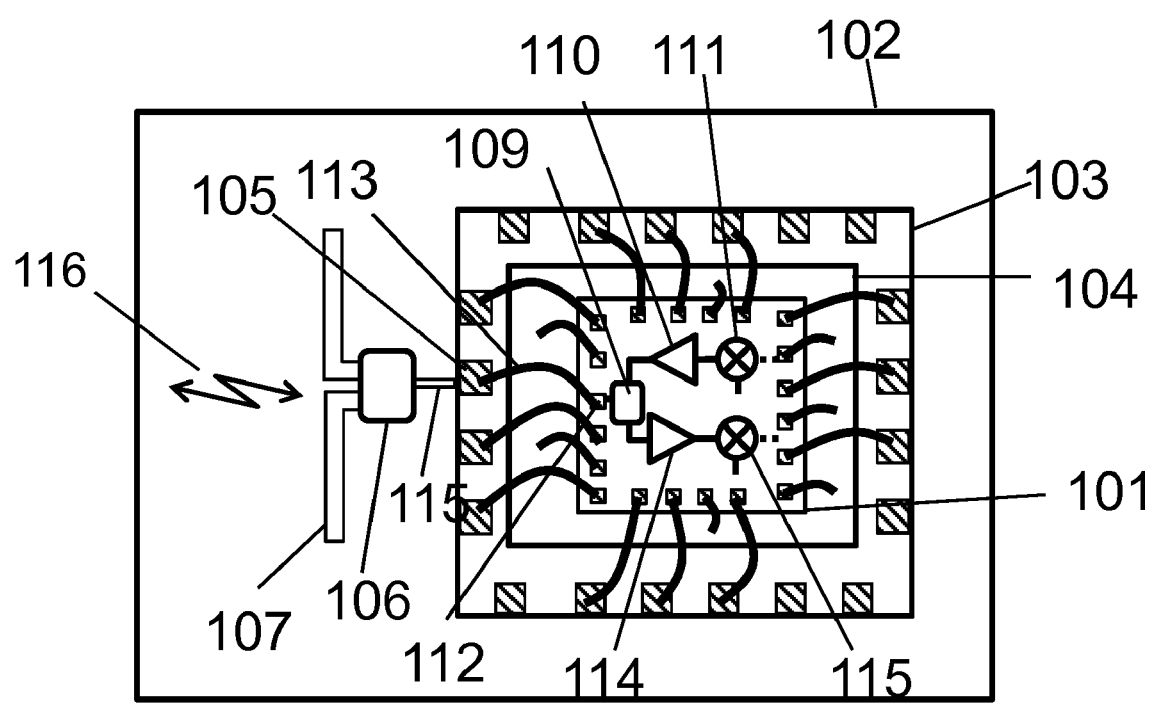
FIG. 1 is a prior art transceiver module with a packaged chip and antenna on board.
Figure 2:
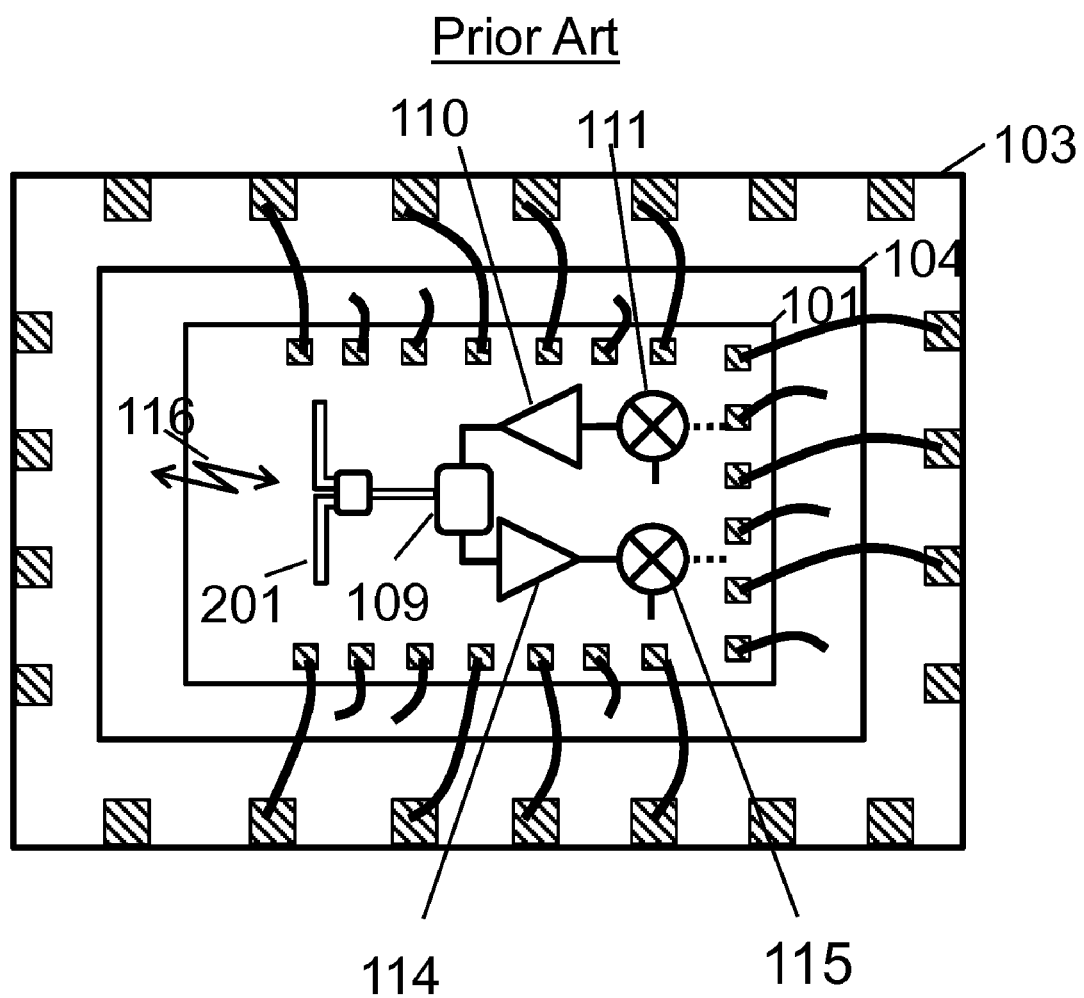
FIG. 2 is a prior-art typical integrated chip containing both the circuitry and the antenna.
Figure 3:
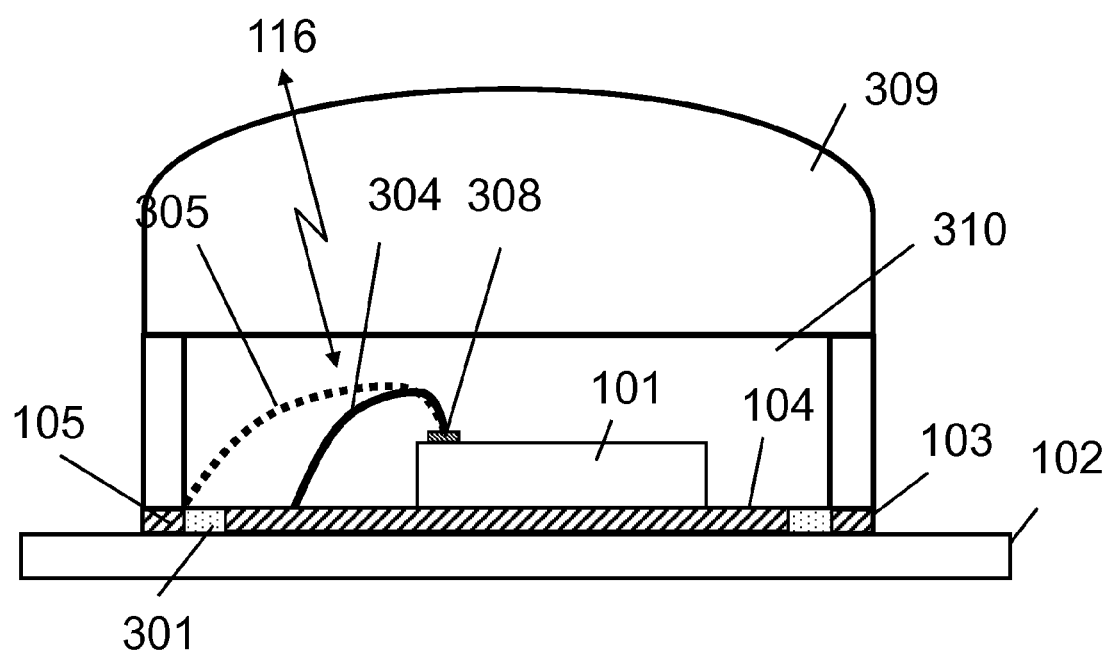
FIG. 3 is an embodiment showing a cross-section of a module with package interconnections and a dielectric cover.
Figure 4:
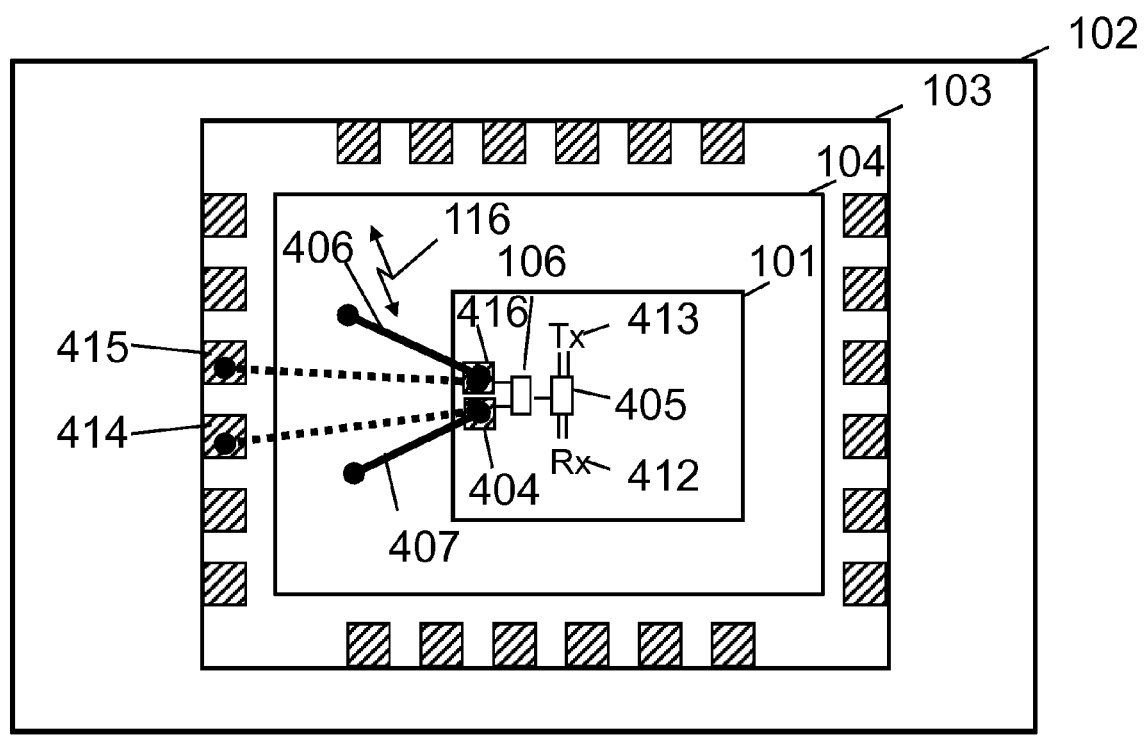
FIG. 4 is a top view of transceiver module of FIG. 3.
Figure 9:
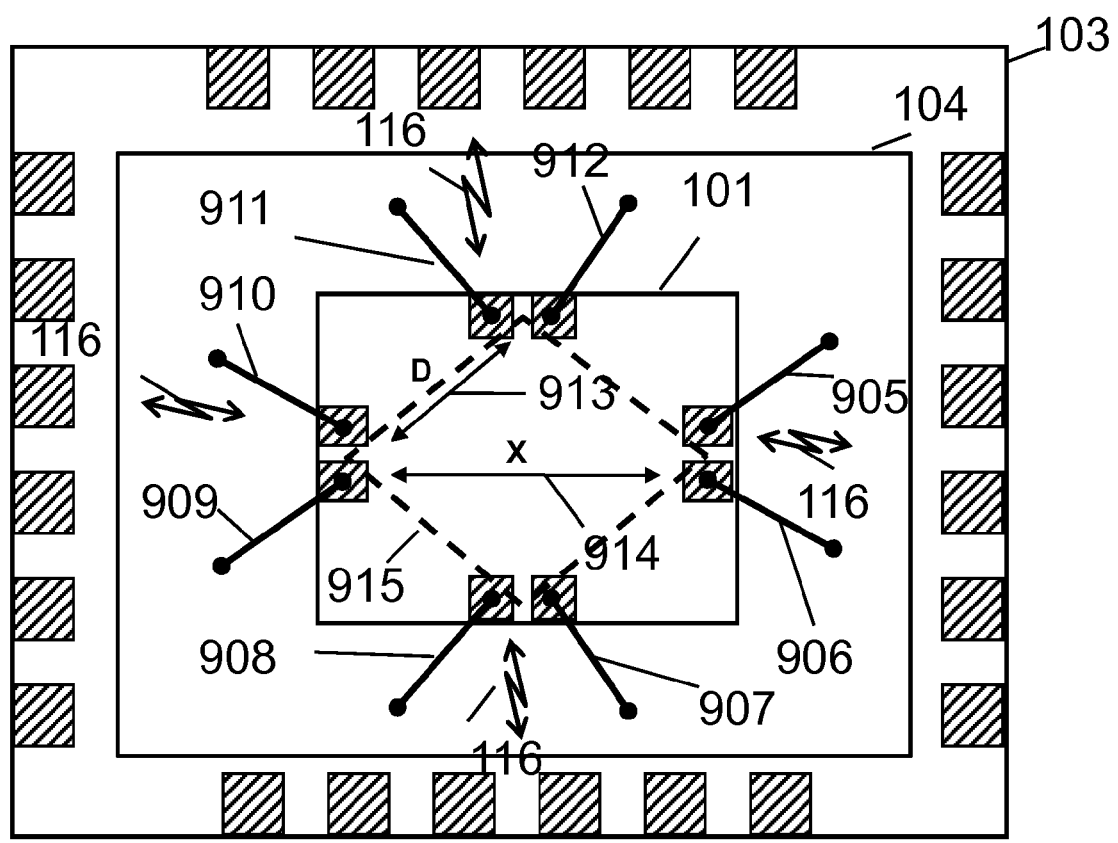
FIG. 9 is an embodiment of a four-element array of interconnections designed as dipole-like antenna arrays for 60 GHz applications.

| REFRENCE NUMERALS | |
|---|---|
| 100 mm-wave module | 101 semiconductor chip |
| 102 board | 103 package |
| 104 paddle | 105 pin in FIG. 1 |
| 106 balun | 107 board-antenna |
| 109 duplexer | 110 power-amplifier |
| 111 up-converter | 112 chip-pad in FIG. 1 |
| 113 interconnection in FIG. 1 | 114 low-noise amplifier |
| 115 down-converter | 116 electromagnetic waves |
| 201 on-chip antenna | 301 dielectric material |
| 304 interconnection FIG. 3 to paddle | 305 interconnection FIG. 3 to pin |
| 308 chip-pad in FIG. 3 | 309 dielectric cover |
| 310 air | 404 chip-pad FIG. 4 to interconnection 407 |
| 405 duplexer | 406 interconn. FIG. 4 to paddle 2d fm bottom |
| 407 interconn. FIG. 4 to paddle 1st fm bot | 412 receiver |
| 413 transmitter | 414 pin FIG. 4 left edge pkg., upper conn. |
| 415 pin FIG. 4 left edge pkg. lower conn | 416 chip-pad FIG. 4 to interconnection 406 |
| 501 interconnection FIG. 5 1st fm bottom | 502 interconnection FIG. 5 2d fm bottom |
| 503 interconnection FIG. 5 3d from bottom | 504 interconnection FIG. 5 4th fm bottom |
| 505 pin connected to interconnect 501 | 506 pin connected to interconnect 502 |
| 507 pin connected to interconnect 503 | 508 pin connected to interconnect 504 |
| 509 chip-pad in FIG. 5 to interconnection 501 | 510 chip-pad in FIG. 5 to interconnection 502 |
| 511 chip-pad in FIG. 5 to interconnection 503 | 512 chip-pad in FIG. 5 to interconnection 504 |
| 601 interconnection FIG. 6 1st from bottom | 602 interconnection FIG. 6 2d from bottom |
| 603 interconnection FIG. 6 3d from bottom | 604 interconnection FIG. 6 4th from bottom |
| 605 signal-distribution network | 701 return loss |
| 800 polar plot | 801 E-plane-pattern |
| 802 H-plane-pattern | 905 interconn. FIG. 9 R edge chip, 2d fm btm |
| 906 interconn FIG. 9 on R edge chip, 1st from btm | 907 interconn FIG. 9, bot edge chip, 1st R |
| 908 interconn FIG. 9 on bot edge chip, 2d fm L | 909 interconn FIG. 9, L edge chip, 1st fm btm |
| 910 interconn FIG. 9 on L edge chip, 2d fm btm | 911 interconn FIG. 9, top edge chip, 1st fm L |
| 912 interconn FIG. 9, top edge chip, 2d fm L | 913 spacing D |
| 914 spacing X | |
| 915 trapezoid geometry | 1005 intercon FIG. 10, L edg chip, 1st fm top |
| 1006 intercon FIG. 10, top edge chip, 1st fm left | 1013 spacing Y |
| 1014 spacing X | 1015 spacing D |

DETAILED DESCRIPTION

FIG. 3—Elevational View of Packaged Ic

FIG. 3 shows an elevation view of one embodiment, a packaged IC chip. The package is made of an electrically conductive paddle 104, pins 303, and supporting dielectric-material 301. The package contains a chip 101 made of semiconductor material. The package is placed on a PCB 102. The chip constitutes the packaged millimeter-wave transceiver module. The chip contains the transceiver circuit components. The chip is connected to the package by metallic interconnections 304 and 305 that are formed of wires. The interconnections may also be made of, but are not limited to, ribbons, and metallic films. These interconnections are designed as to radiate as an antenna to transmit or receive electromagnetic waves. A dielectric cover 309 may be designed as a dielectric lens. The dielectric cover may be part of package 103. The lens helps change the radiation characteristics of the antenna such as to improve directivity, gain, and coverage.

In FIG. 1, the package has an electrically conductive paddle 104 in the center and electrically conductive leads or pins 303 at the periphery of the package. The paddle provides support for chip 101. Such electrically conductive paddles or pins may be made of metallic material including, but not limited to, copper, aluminum, other metals, and metal alloys. Alternatively, the paddle or pins can be made of any material that is coated with electrically conductive thick or thin films. Such conductive films can be made of material including, but not limited to, gold, copper and silver. The paddle is also typically used to provide a return path for the ground signals for the circuits in chip 101.

The chip contains the transceiver circuit components. Interconnections 304 connect the chip pads 308 on the chip to the paddle 104 of package 103. Package 103 is made of dielectric material including, but not limited to, plastic, ceramic, and other dielectrics. Interconnection 305 connects between package pins 303 and chip pads 308. The chip pad is usually the top most conductive layer of the semiconductor Integrated Circuit (IC) and is used for connecting interconnects such as metallic ribbons.

Interconnections 304 and 305 are designed as antennas. This greatly reduces the cost of the millimeter-wave transceiver chips and modules in addition to reducing their size. A dielectric cover 309 is placed on the package to protect it from external elements. The cover encloses the chip and the interconnections. The dielectric cover can also be used to refract the electromagnetic waves 314; thereby changing the radiation pattern of the antennas for better directivity and gain. Dielectric cover 309 can be hollow with a volume of air 310 surrounding the chip. Alternatively, volume 310 can be filled with some dielectric material. Generally, the radiation in the air medium may give higher efficiency. On the other hand, a dielectric with a low loss and a low dielectric constant can also provide rigidity and thereby is more reliable in face of abrupt motion or acceleration.

Although this embodiment describes a plastic or ceramic package, one of ordinary skill can use this for other methods of implementations. The package can be replaced with a carrier, such as a PCB. The metallic paddle can be replaced by a first surface preferably of conductive nature, while the pins can be replaced by a second surface, which also is conductive.

FIG. 4—Top View of Packaged IC

FIG. 4 shows the top view of the embodiment of FIG. 3. In FIG. 4 chip 101 comprises of a receiver (Rx) 412, transmitter (Tx) 413, a duplexer 405, and a balun 106. A duplexer combines or separates two frequencies, one used by the receiver and the other by the transmitter. One end of each of interconnections 406 and 407 (also shown as 304 in FIG. 3) is connected to the paddle of the package. The other end of each of these interconnections is connected to chip pads 404 and 416 of the chip. Alternatively, they can also be connected to pins 414 and 415 as shown by dotted lines in FIG. 4 (also shown as 305 in FIG. 3). These interconnections are designed as antennas to radiate electromagnetic waves 116. These interconnections can be configured in many different ways, thereby providing different antenna characteristics. FIG. 4 shows one of simplest way for connecting: two interconnections are connected at an angle to form a dipole-like antenna. The paddle may be at effective ground by using various means including, but not limited to (1) connecting to zero potential ground, (2) achieving a virtual ground by symmetry, and (3) a ground connection through reactive coupling such as through capacitor or inductors.

As is well known, an antenna can be considered as a half-wavelength resonator at desired frequency that is coupled from a signal source. Traditional dipoles have two open-ended quarter-wave conductors; together they make up a half-wavelength. However, in the embodiment of FIG. 4, one of the ends of each of the interconnections is connected to the grounded paddle. In order to form an open-ended quarter-wavelength equivalent, the electrical length of each interconnection is increased by a quarter-wavelength. This allows it to behave like a dipole antenna. Each interconnection antenna has an effective electrical length of half a wavelength. Thus, the total length of the two interconnections is of the order of one-wavelength instead of the traditional half-wavelength.

Alternatively one end of each interconnection can be grounded to the paddle to keep the total antenna length to a half wavelength only. This reduces the size of the antenna by half. Compared to the wavelength the long dipole-like antenna mentioned above, it requires a different type of excitation and impedance matching. The antenna also has a slightly different pattern but is usable.

Since the impedance of the transmission line repeats with multiples of a half wavelength, there are a number of other possible lengths for the antenna. Based on this, it can be seen that the effective electrical length of the interconnection is approximately a natural number multiple of quarter-wavelengths for implementing this antenna. As one with ordinary art will realize, for achieving a given electrical length, the physical length can be changed by providing capacitive and inductive loading.

The dipole-like antenna described uses the package interconnections and can be made using the regular chip packaging process. Hence, it would not cost anything extra to manufacture the antenna. The antenna can be fed differentially through balun 106 as shown in FIG. 4. This method of feeding differentially is called balanced-method. Alternatively, it can be single-ended method with only one interconnection, thereby forming a loop from a chip to the paddle. In FIG. 4, the antenna is symmetric and each wire is of equal length. However, in practice to optimize it for the required performance, the wires may be of different lengths. Moreover, the geometry of the antenna shown in FIG. 4 is V-shaped. In practice it can be of any angle and shape, thereby enabling it to be designed to have a variety of antenna radiation patterns, gain, directivity, form factor, and so on.

Figure 5:
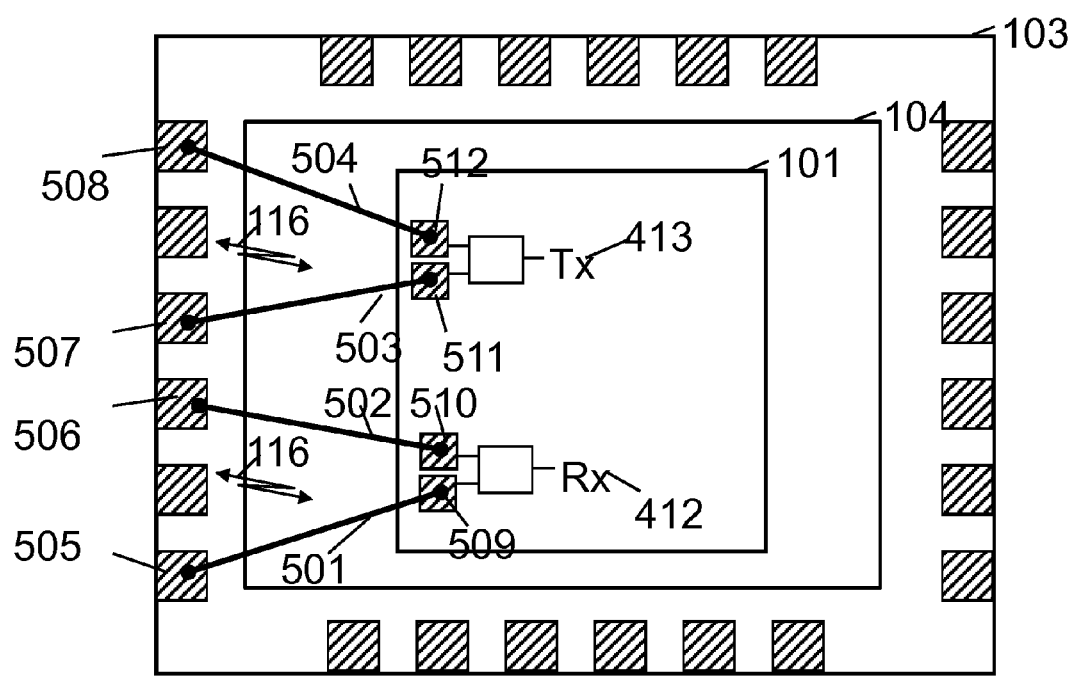
FIG. 5 is an embodiment showing interconnections designed as an antenna between chip pads and package pins.

FIG. 5—Packaged IC with Interconnections on Pin

In FIG. 5, Instead of joining interconnections to the paddle, package interconnections 501, 502, 503, and 504 are connected between chip pads 509, 510, 511, and 512 to package pins 505, 506, 507, and 508, respectively. Again the effective length of each interconnection is a natural number of quarter wavelengths. This allows the interconnections to work effectively as antennas. The actual length may be optimized in accordance with the parasitics of package 103.

Figure 6:
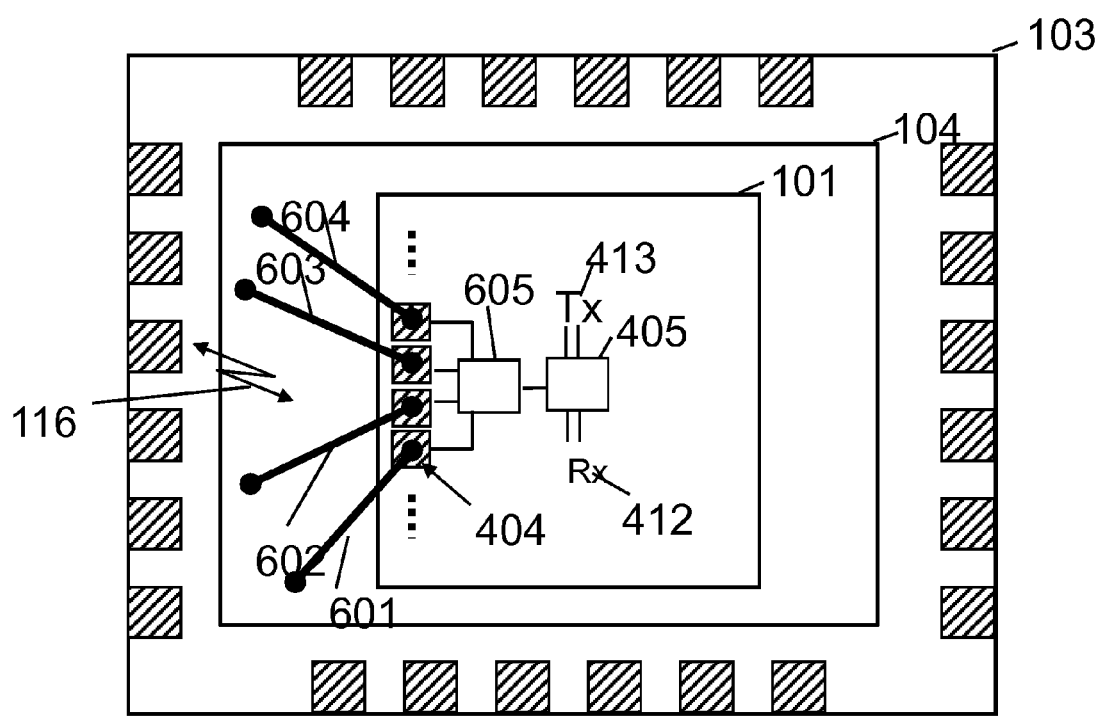
FIG. 6 is a top view of a transceiver module with interconnections designed as antenna array.

FIG. 6—Packaged IC with Interconnections as Arrays

FIG. 6 shows an embodiment of an antenna array with multiple interconnections 601, 602, 603, and 604. The array is fed from a signal-distribution-network 605. This technique avoids increasing the chip or package size for a multiple element antenna array. Hence, this technique greatly reduces the cost and size of the millimeter-wave transceiver module. Multiple antennas using the interconnections described in the embodiment of FIG. 6 can also be used to provide antenna diversity. The package and the chip has four sides as shown in FIG. 6. Therefore, the interconnections forming the antenna can be placed in any of the four sides or corners of the chip.

Figure 7:
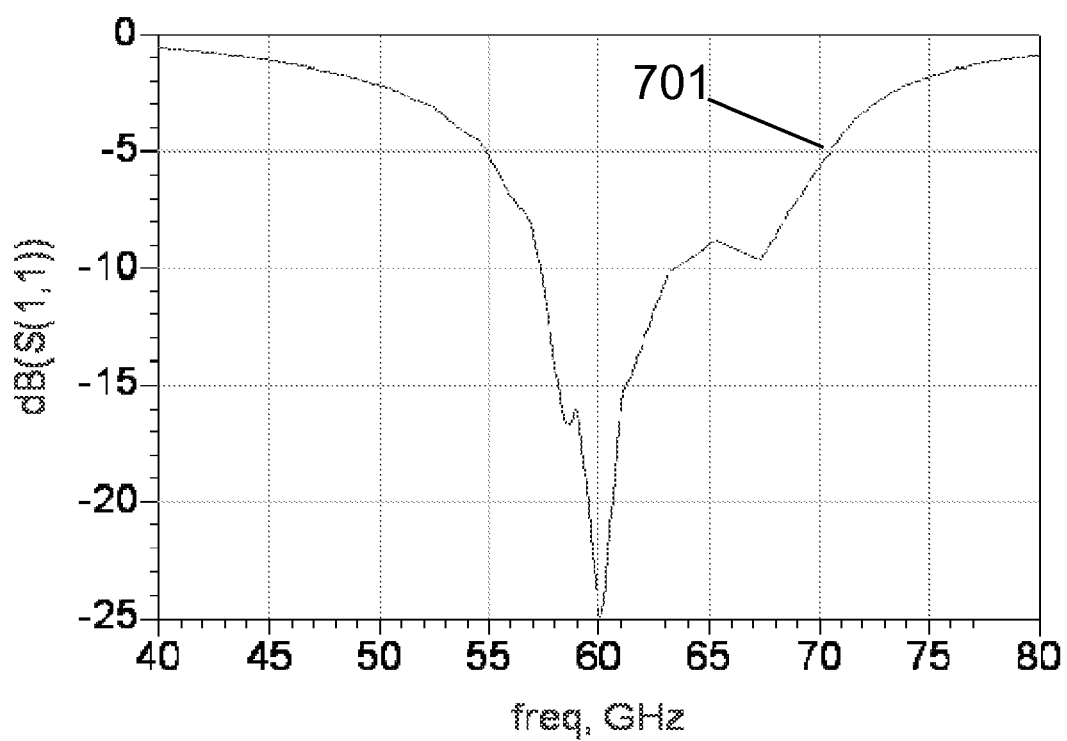
FIG. 7 is electromagnetically simulated return loss of interconnection antenna at 60 GHz for the configuration of FIG. 4.

FIG. 7—Plot of Return Loss

FIG. 7 is a plot showing the return-loss 701 of the antenna of FIG. 4. More negative the value of dB(S(1,1)) in the figure, better is the return loss. This antenna is designed for 57-64 GHz band applications. The antenna is fed using balanced 50 ohm source. A simulated bandwidth of about 5 GHz is attained with 10 dB return loss.

Figure 8:
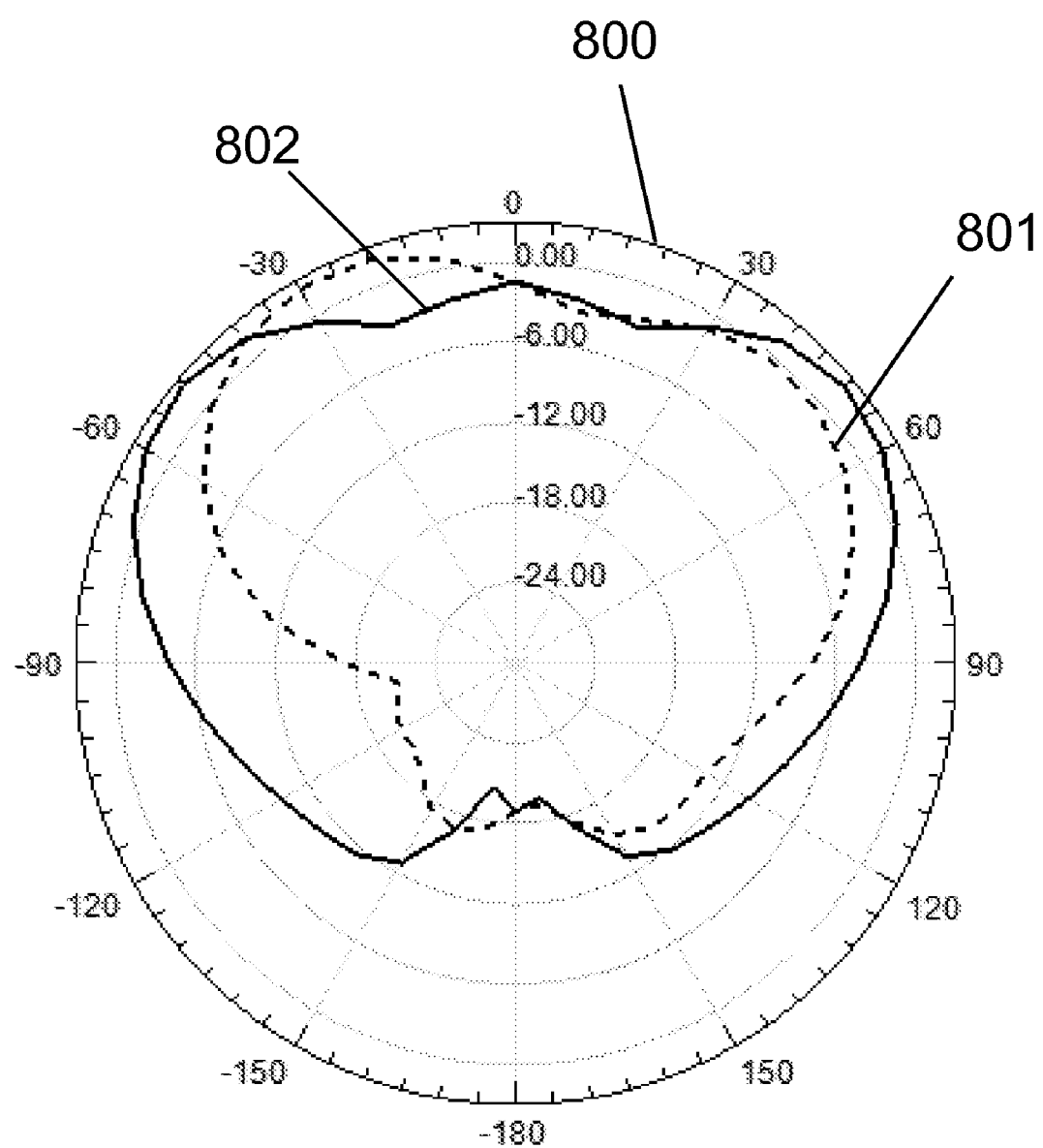
FIG. 8 is electromagnetically simulated 2-dimensional radiation pattern for the antenna configuration of FIG. 4.

FIG. 8—Plot of Radiation Pattern

FIG. 8 depicts a two-dimensional polar plot 800 showing E-plane-pattern 801 and H-plane-pattern 802 for the embodiment of FIG. 4. The radiation pattern represents the antenna gain in different directions at 60 GHz. There is very less radiation in the lower semicircle of the polar plot. This is because the paddle under the antenna acts as a ground plane that reflects the electromagnetic waves. The maximum simulated gain is about 2 dB. Such radiation patterns are typically 8 dB better than those available using on-chip radiators.

FIG. 9—Packaged IC with Four-Element Antenna Array at Edges

FIG. 9 shows an arrangement of interconnections connected to the paddle to form a four-element antenna array. Each element is an antenna. Each antenna element can consist of many interconnects called sub-elements or sub-interconnections. The package contains the chip connected to the paddle. The chip can have a plurality of transmitter and receiver circuits. Interconnections 911 and 912 form an antenna positioned along the center of the top edge of the chip. Similarly, interconnections 905 and 906 form another antenna at the center of the right side. Similarly, interconnections 907 and 908 form another antenna element on the bottom and interconnections 909 and 910 form an antenna on the left side. This arrangement provides a four-element antenna array arranged at the corners of trapezoid 915 geometry, yet provides a small chip area. Spacings D 913 and X 914 are the distances between the elements of the antenna array that play a significant role in determining scanning angle and radiation pattern for these phased-array antennas. Typically, for 60 GHz, spacing D is of the order of 2.5 mm which is a half wavelength. With this spacing the chip size is about 3.6 mm by 3.6 mm (2.5×sqrt(2) mm). The dimensions mentioned here are contemplated for 60 GHz applications but other dimensions are suitable too. The chip size can be reduced by the alternative arrangement shown in FIG. 10.

Figure 10:
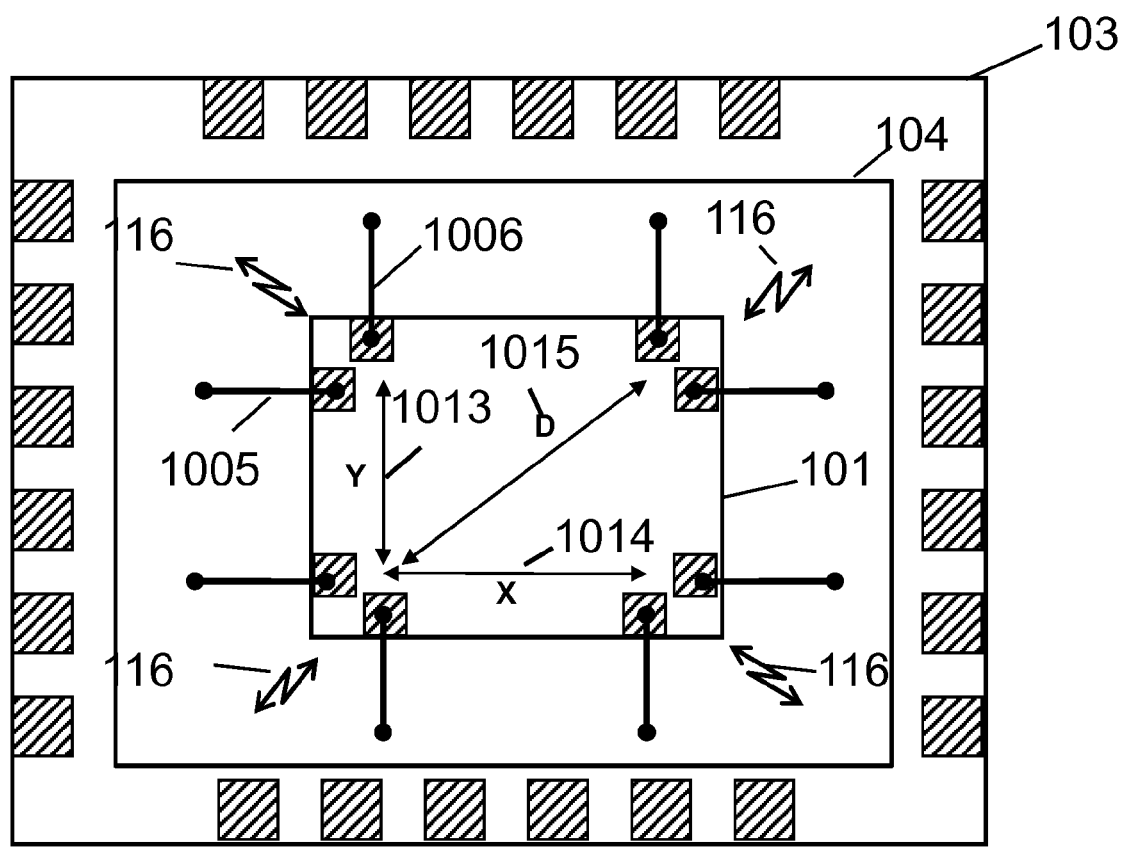
FIG. 10 is an embodiment for 60 GHz applications where the interconnections are attached at the corner of the chip.

FIG. 10—Packaged IC with Four-Element Antenna Array at Corners

In FIG. 10, interconnections such as 1005 and 1006 are placed at the corners of the chip. This interconnection pair forms a dipole-like antenna. The interconnection pair is angled at 90-degrees, although other arrangements are also possible. Four such antennas are placed at the corners of chip 101, forming a four-element antenna array. This allows the chip to be further reduced in size compared to that in FIG. 9. Spacings Y 1013 and X 1014 can now be 2.5 mm each, reducing the chip size to 2.5 mm by 2.5 mm. Spacing D 1015 is about 3.6 mm. These dimensions are contemplated for 60 GHz applications but other dimensions are suitable too. Also the four-element antenna can be placed on the corner of a trapezoid and other arrangements as one with ordinary skill in the art will foresee.

CONCLUSIONS, RAMIFICATIONS, SCOPE

Accordingly, the reader will see that the interconnections of the various embodiments can be used to make antennas for millimeter-wave communications. The size of the chip and the module is reduced, thereby reducing manufacturing cost. In addition the efficiency of the antenna is relatively large compared to antennas on a chip or antennas on board because it is surrounded by air. Moreover, it does not require any additional manufacturing steps; the regular bonding procedure used for making interconnections also makes the antennas. Furthermore, the interconnections have additional advantages in that:

- a plurality of interconnections can be easily used as antenna arrays or antennas for applications requiring diversity without growing the chip or module size, thereby reducing cost;
- a specific four-element antenna array can easily be designed for optimum performance by placing the interconnections at the four edges or four corners of the chip, thereby achieving the smallest chip size;
- it allows the use of a dielectric cover as an electromagnetic lens to increase the gain of the antenna in addition to providing immunity to external impurities;
- it antennas to be placed in any orientation with ease; and
- it provides flexibility for tuning the antenna for the optimum performance with minimum cost and minimizing time to market.

While a number of embodiments have been described, various modifications may be made without departing from the spirit and scope. For example, only a single interconnection from chip to the package pins or package paddle can be utilized as an antenna with a single-ended microstrip feed from the transceiver circuit. The interconnections shapes and position can be on any side of the chip. A number of interconnections in different orientations can be used to switch between radiation patterns to cover the whole radiation space. The beam focusing dielectric cover can be shaped to provide the required characteristics and shape of the beam forming, etc.

Accordingly, other embodiments are within the scope of the following claims and their legal equivalents and not by the examples given.

The invention claimed is:

1. An apparatus that radiates at millimeter-wave frequencies comprising:
   a. a package comprising an electrically conductive paddle and at least one electrically conductive pin physically separate from said electrically conductive paddle,
   b. a chip having a conductive chip pad, said chip being attached to said conductive paddle and having at least a first conductive member thereon,
   c. at least one interconnection comprising an electrically conductive length of material having first and second ends,
   d. said first end of said interconnection being connected to said first conductive member on said conductive chip pad and said second end being connected to a second member selected from the group consisting of said conductive paddle and said one electrically conductive pin, whereby said interconnection can radiate electromagnetic energy so as to form an antenna element that can radiate at millimeter-wave frequencies for millimeter-wave systems.

2. The apparatus of claim 1, further comprising a means for providing an effective ground, said second end being connected to said effective ground.

3. The apparatus of claim 2 wherein the effective electrical length of said interconnection is approximately a natural number multiple of quarter wavelengths at a predetermined millimeter-wave frequency.

4. The apparatus of claim 2 wherein said interconnection comprises two interconnections forming two antenna elements and said two antenna elements are excited in opposite phase to form a dipole-like antenna.

5. The apparatus of claim 2 wherein said interconnection comprises a plurality of interconnections forming a plurality of said antenna elements, thereby forming an antenna array with a specific radiation pattern.

6. The apparatus of claim 5 wherein said antenna array comprises at least four antenna elements that are arranged at the corners of a trapezoid.

7. The apparatus of claim 6 wherein said four antenna elements comprise eight antenna sub-elements that are configured to form four dipole-like antennas.

8. The apparatus of claim 1, further including a dielectric material that covers said apparatus such that said dielectric material changes the radiation characteristics of said interconnection.

9. The apparatus of claim 1 wherein said interconnection is coupled to circuitry on said chip by using a coupling selected from the group consisting of single-ended and balanced.

10. The apparatus of claim 1 wherein said conductive paddle and said electrically conductive pins comprise metallic material; said package further including a plastic material for physically supporting said conductive paddle and said electrically conductive pins, and said second member is effectively at ground potential; and further including a plastic cover enclosing said one interconnection and said chip and effectively forming a cavity, thereby shaping the radiation characteristics of said interconnection; whereby said interconnection forms said antenna element of an antenna array with a specific antenna pattern and said apparatus radiates electromagnetic energy for use in millimeter-wave systems.

11. The apparatus in claim 10 wherein said cavity is filled with dielectric material, thereby providing rigidity to said interconnections to increase reliability.

12. A method of radiating electromagnetic energy at a millimeter-wave frequency comprising,
   a. providing an electrically conductive paddle and a chip attached to said paddle,
   b. providing a conductive chip pad on said chip for providing electrical connections to said chip,
   c. providing at least one electrically conductive pin in juxtaposition to said conductive paddle to provide a surface for connection,
   d. connecting said conductive chip pad to a chosen member selected from the group consisting of said one electrically conductive pin and said electrically conductive paddle using at least one interconnection made from an electrical conductive length of material,
   e. designing said one interconnection to radiate by means of its said electrical conductive length, thereby forming an antenna element,
   whereby radiation of said antenna element can be used for radiating electromagnetic waves useful for millimeter-wave wireless systems.

13. The method of claim 12, further comprising a means for achieving effective ground and connecting said second end of interconnection to said effective ground.

14. The method recited in claim 12 wherein effective electrical length of said interconnection is approximately an odd natural number multiple of quarter-wavelengths.

15. The method of claim 12 wherein said interconnection comprises two subinterconnections forming two antenna elements and said two antenna elements are excited in opposite phase to form a dipole-like antenna.

16. The method of claim 12 wherein said at least one interconnection comprises a plurality of interconnections forming a plurality of said antenna elements, thereby forming an antenna array with specific radiation pattern.

17. The method of claim 12 wherein said antenna array comprises at least four antenna elements located on four corners of a trapezoid.

18. The method of claim 12, further including a dielectric material that covers said antenna elements and chip such that said dielectric material changes radiation characteristics.

19. The method of claim 12 wherein said one interconnection is coupled to the circuitry on said chip by using a method selected from the group consisting of single ended method and balanced method.

20. The method of claim 12 wherein said conductive paddle and said electrically conductive pins comprise metallic material; said package further including dielectric material for physically supporting said conductive paddle and said electrically conductive pins; and said chosen member is effectively at ground potential; and further including a dielectric cover enclosing said one interconnection and said chip and effectively forming a cavity, thereby shaping the radiation characteristics; of said interconnection; whereby said interconnection forms said antenna element of an antenna array with a specific antenna pattern; and said apparatus radiates electromagnetic energy for use in millimeter wave systems.

21. The method of claim 12 wherein said cavity is filled with dielectric material, thereby providing rigidity to said interconnections to increase reliability.

22. An apparatus that radiates at millimeter-wave frequencies comprising:
   a. a carrier that has a first surface and at least one second surface, said second surface being conductive,
   b. a chip containing circuitry, said chip being attached to said first surface of said carrier,
   c. at least one interconnection comprising a length of electrically conductive material,
   d. said one interconnection having first and second ends,
   e. said first end of said interconnection being connected to said chip and said second end being connected to said second surface
   whereby said one interconnection provides a means for radiating, thereby forming an antenna for radiating electromagnetic energy for millimeter-wave systems.

23. The apparatus of claim 22, further comprising a means for providing an effective ground and means connecting said second end of said interconnection to said effective ground.

24. The apparatus of claim 22, further including at least one additional interconnection having first and second ends with said first end connected to said chip and said second end connected to said second surface so that said one interconnection and said additional interconnection form an antenna array.

* * * * *